(12) United States Patent
Zhao et al.

(10) Patent No.: US 9,128,879 B2
(45) Date of Patent: Sep. 8, 2015

(54) FAULT DIAGNOSING METHOD BASED ON SIMULATED VACCINE

(71) Applicant: Tsinghua University, Beijing (CN)

(72) Inventors: Jinsong Zhao, Beijing (CN); Yiyang Dai, Beijing (CN); Yidan Shu, Beijing (CN); Jianfeng Zhu, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 14/235,062

(22) PCT Filed: Nov. 29, 2012

(86) PCT No.: PCT/CN2012/085578
§ 371 (c)(1),
(2) Date: Jan. 26, 2014

(87) PCT Pub. No.: WO2014/005394
PCT Pub. Date: Jan. 9, 2014

(65) Prior Publication Data
US 2015/0106655 A1 Apr. 16, 2015

(30) Foreign Application Priority Data
Jul. 3, 2012 (CN) .......................... 2012 1 0229367

(51) Int. Cl.
*G06F 11/00* (2006.01)
*G06F 11/14* (2006.01)
(Continued)

(52) U.S. Cl.
CPC ............ *G06F 11/1417* (2013.01); *G05B 17/02* (2013.01); *G06F 17/5009* (2013.01); *G06F 2201/85* (2013.01)

(58) Field of Classification Search
CPC .................................................. G06F 17/5009
See application file for complete search history.

(56) References Cited

U.S. PATENT DOCUMENTS 6,556,951 B1 *  4/2003  Deleo et al. ................... 702/183
7,599,822 B2 * 10/2009  Hearn et al. ...................... 703/2
(Continued)

FOREIGN PATENT DOCUMENTS

| CN | 102110187 | 6/2011 |
| CN | 102436252 | 5/2012 |
| CN | 102760208 | 10/2012 |

OTHER PUBLICATIONS

International Searching Authority, International Search Report and Written Opinion, Mar. 19, 2013.

*Primary Examiner* — Loan L. T. Truong
(74) *Attorney, Agent, or Firm* — Hodgson Russ LLP

(57) ABSTRACT

A fault diagnosing method based on a simulated vaccine is provided. The fault diagnosing method comprises steps of: establishing a dynamic simulation model for simulating a start-up operation and a steady-state operation of a technological process according to process information, an operating procedure and historical data of the technological process; running the dynamic simulation model; extracting data within a first predetermined time from the simulated normal sample set to generate a normal simulated vaccine, and extracting data within a second predetermined time from the simulated fault sample set to generate a fault simulated vaccine; acquiring the historical data of the technological process; obtaining an immune antibody coefficient of the normal simulated vaccine, and generating a normal antibody library; and obtaining an immune antibody coefficient of the fault simulated vaccine, and generating a fault antibody library according to the fault simulated vaccine.

13 Claims, 5 Drawing Sheets

(51) Int. Cl.
    *G05B 17/02*    (2006.01)
    *G06F 17/50*    (2006.01)

(56) References Cited

U.S. PATENT DOCUMENTS

| | | | |
|---|---|---|---|
| 8,000,928 B2* | 8/2011 | Scott et al. | 702/179 |
| 8,306,788 B2* | 11/2012 | Chen et al. | 703/1 |
| 8,909,541 B2* | 12/2014 | Fairfax et al. | 705/7.37 |
| 9,053,260 B2* | 6/2015 | Romatier et al. | 1/1 |
| 2004/0191229 A1* | 9/2004 | Link et al. | 424/93.21 |
| 2006/0111873 A1* | 5/2006 | Huang et al. | 702/185 |
| 2008/0115029 A1* | 5/2008 | Kusko et al. | 714/742 |
| 2008/0172576 A1* | 7/2008 | Kusko et al. | 714/33 |
| 2009/0089035 A1* | 4/2009 | Solomon | 703/11 |
| 2010/0153086 A1* | 6/2010 | Satoh | 703/14 |
| 2012/0151428 A1* | 6/2012 | Tanaka et al. | 716/112 |
| 2012/0191358 A1* | 7/2012 | Oliphant et al. | 702/19 |
| 2012/0271610 A1* | 10/2012 | Phillips et al. | 703/11 |
| 2013/0046517 A1* | 2/2013 | Baym et al. | 703/2 |
| 2013/0226544 A1* | 8/2013 | Mcconaghy et al. | 703/2 |
| 2015/0051890 A1* | 2/2015 | Saha et al. | 703/6 |

* cited by examiner

FAULT DIAGNOSING METHOD BASED ON SIMULATED VACCINE

CROSS-REFERENCE TO RELATED APPLICATION

This application claims priority to and benefits of Chinese Patent Application Serial No. 201210229367.1, filed with the State Intellectual Property Office of P. R. China on Jul. 3, 2012, the entire content of which is incorporated herein by reference.

FIELD

The present disclosure relates to the field of a technological process production, and more particularly to a fault diagnosing method based on a simulated vaccine.

BACKGROUND

With the development of modern science and technology, the complexity of process industries such as a chemical process, a refining process or a biopharmaceutical process has been increasing. More and more auxiliary devices such as a distributed control system (DCS) or a manufacturing execution system (MES) have been widely used for monitoring an on-line production operation so as to ensure the stable and safe running of a technological process. At the same time, with the improvement of a production automation level, the number of operators in a plant is greatly reduced in recent years than in the past years, so that one operator may need to operate one or even more production units or devices. A simple variable alarm is insufficient to provide the most direct signal for the operator to handle emergency situations, and the operator needs to determine a possible state of the technological process with a lot of experience, which may cause more serious consequences due to the misjudgment or operating lag of a less experienced operator.

Currently, a separate fault diagnosing system is established to detect and diagnose a cause of a fault and to show the type of a fault which may occur to the operator through an interface, which may not only ensure the stability of a production running and prevent the occurrence of major accidents but also may help the operator to handle and repair the fault so as to reduce losses caused by the fault effectively.

Firstly, a perfect on-line fault diagnosing system must be able to quickly detect a fault after a disturbance occurs and be able to accurately diagnose the possible type of the fault based on a rapid effective fault diagnosing method. Secondly, the on-line fault diagnosing system must be able to have a complete structure, be able to acquire data from an on-line running device, and be able to show a diagnostic result to the operator through a friendly interface after a core diagnosis is completed. Finally, the fault diagnosing method must have a self-adaptive capacity and a self-learning ability, and the on-line fault diagnosing system must use on-line data to achieve the self-learning of the on-line fault diagnosing system and to improve the on-line fault diagnosing capability of the on-line fault diagnosing system according to the feedback of the operator.

An artificial immune system is an integrated intelligent system, which combines immunology with engineering and uses mathematics, computer technology, etc. to establish an immune mechanism model and applies the immune mechanism model to the design, implementation, etc. of a technological process. Judgment of self and non-self in the artificial immune system is introduced into the field of a fault diagnosis. A dynamic artificial immune system is configured to perform an on-line fault diagnosis for a technological process by calculating a difference degree of an antigen and an antibody using dynamic variable data of the technological process as a drive, using a historical data time sequence matrix as the antibody and using an on-line data time sequence matrix as the antigen on account of the dynamic characteristics of the technological process.

However, many new technological processes have not experienced a long-time running and lack available historical samples. In this case, due to the lack of historical data, the dynamic artificial immune system may not diagnose a fault effectively. Accordingly, it is necessary to propose a newer mechanism to produce an antibody which may be used for a dynamic artificial immune fault diagnosis.

SUMMARY

Embodiments of the present disclosure seek to solve at least one of the problems existing in the prior art to at least some extent.

Accordingly, a fault diagnosing method based on a simulated vaccine is provided, which may overcome the defect of the lack of historical data of a technological process, detect a fault in the technological process effectively, accurately and rapidly, and determine the type of the fault.

According to an embodiment of the present disclosure, a fault diagnosing method based on a simulated vaccine is provided. The fault diagnosing method comprises steps of: establishing a dynamic simulation model for simulating a start-up operation and a steady-state operation of a technological process according to process information, an operating procedure and historical data of the technological process; running the dynamic simulation model to obtain a simulated sample set of simulated running data in a plurality of states, in which the simulated sample set has various types of simulated samples and comprises a simulated normal sample set and a simulated fault sample set, the simulated normal sample set comprises simulated data sample sets obtained during a normal start-up operation and during a normal steady-state operation, and the simulated fault sample set comprises fault data sample sets corresponding to a plurality of faults generated during the start-up operation and during the steady-state operation; extracting data within a first predetermined time from the simulated normal sample set to generate a normal simulated vaccine, and extracting data within a second predetermined time from the simulated fault sample set to generate a fault simulated vaccine; acquiring the historical data of the technological process to generate a historical sample set comprising a historical normal sample set and a historical fault sample set; obtaining an immune antibody coefficient of the normal simulated vaccine according to a historical normal sample in the historical normal sample set and a normal simulated vaccine corresponding to the historical normal sample in the historical normal sample set, and generating a normal antibody library according to the normal simulated vaccine; and obtaining an immune antibody coefficient of the fault simulated vaccine according to a historical fault sample in the historical fault sample set and a fault simulated vaccine corresponding to the historical fault sample in the historical fault sample set, and generating a fault antibody library according to the fault simulated vaccine.

In addition, the fault diagnosing method based on the simulated vaccine according to an embodiment of the present disclosure may also have the following additional technical features.

In one embodiment, the fault diagnosing method further comprises: calculating a minimum difference degree matrix between a fault start-up historical sample and a normal start-up historical sample by a DTW algorithm.

In some embodiments, the fault diagnosing method further comprises: running an actual technological process to obtain a sample of on-line running data; and extracting a data fragment set within a predetermined time range before a current moment from the sample of the on-line running data.

In some embodiments, the fault diagnosing method further comprises: calculating a difference degree of an antigen at the current moment and each normal antibody in the normal antibody library to obtain a difference degree set; and determining whether each difference degree in the difference degree set is less than a threshold of the normal antibody library, and if yes, determining that the technological process is normal, otherwise, determining that there is a fault in the technological process.

In some embodiments, the fault diagnosing method further comprises: determining a type of the fault in the technological process after determining that there is the fault in the technological process.

In some embodiments, the fault diagnosing method further comprises: for the start-up operation, acquiring normal start-up sample data of a normal start-up historical sample $H_N^{n \times l}$ under a condition similar to a current operating condition, and calculating a deviation matrix by the DTW algorithm or by a first predetermined formula as a diagnostic antigen; for the steady-state operation, acquiring a value of each sampling point in a fragment of the on-line running data, and subtracting a datum D obtained at a moment when a fault is detected from the value of each sampling point to obtain a diagnostic antigen; calculating a difference degree of a diagnostic antigen at the current moment and each fault antibody in the fault antibody library by the DTW algorithm or by a second predetermined formula; and if the difference degree of the diagnostic antigen at the current moment and one fault antibody is less than a threshold of the fault antibody library, determining that the fault of the technological process is of a corresponding fault type.

In some embodiments, the step of establishing the dynamic simulation model comprises: establishing the dynamic simulation model by a process simulation software or by a differential equation.

In some embodiments, the process information comprises a process flow chart, a material state, operating parameters, controller settings and environmental parameters.

In some embodiments, the step of running the dynamic simulation model to obtain the simulated sample set of the simulated running data in the plurality of states further comprises: normalizing each simulated datum in a set of the simulated running data by a following formula to obtain the simulated sample set:

$$X = 0.5 + \frac{x - \overline{X}}{X_{max} - X_{min}}$$

where x is a simulated datum of a variable in a simulated sample, $\overline{X}$ is an average value of historical data of the variable x under an actual normal operating condition, and $X_{max}$ and $X_{min}$ are a maximum value and a minimum value of the historical data of the variable x under the actual normal operating condition respectively.

In some embodiments, running the actual technological process to obtain the sample of the on-line running data further comprises: normalizing the sample of the on-line running data.

In some embodiments, the fault diagnosing method further comprises: acquiring the historical data of the technological process; and correcting the dynamic simulation model according to the historical data.

In some embodiments, the step of running the dynamic simulation model to obtain the simulated sample set of the simulated running data in the plurality of states further comprises: adding a disturbance within a normal operating range to the dynamic simulation model to generate the simulated normal sample set when the dynamic simulation model is run; and adding a fault disturbance to the dynamic simulation model to generate the simulated fault sample set when the dynamic simulation model is run, in which each of the disturbance within the normal operating range and the fault disturbance comprises environmental parameters, a noise and operating parameters.

In some embodiments, the fault diagnosing method further comprises: updating an antibody in a corresponding antibody library by the on-line running data according to a comparison between an on-line antigen and the normal antibody library and a comparison between the on-line antigen and the fault antibody library.

With the fault diagnosing method based on the simulated vaccine according to an embodiment of the present disclosure, the defect of the lack of historical data of an actual production device (or a technological process of the actual production device) may be overcome, and normal running data, fault running data and antibodies are generated by dynamic simulation to be applied to a process industrial fault diagnosis based on an artificial immunity. With new methods for generating antigens, antibodies, an antibody library and an antigen library proposed according to an embodiment of the present disclosure, a large number of different antibodies may be generated by process simulation, cloning and mutation during the process of diagnosing a fault in the technological process, and antibodies are automatically updated while performing the fault diagnosis, which may meet the requirements of an actual industrial process for adaptability. Therefore, the fault in the technological process may be detected effectively, accurately and rapidly, and the type of the fault may be determined.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
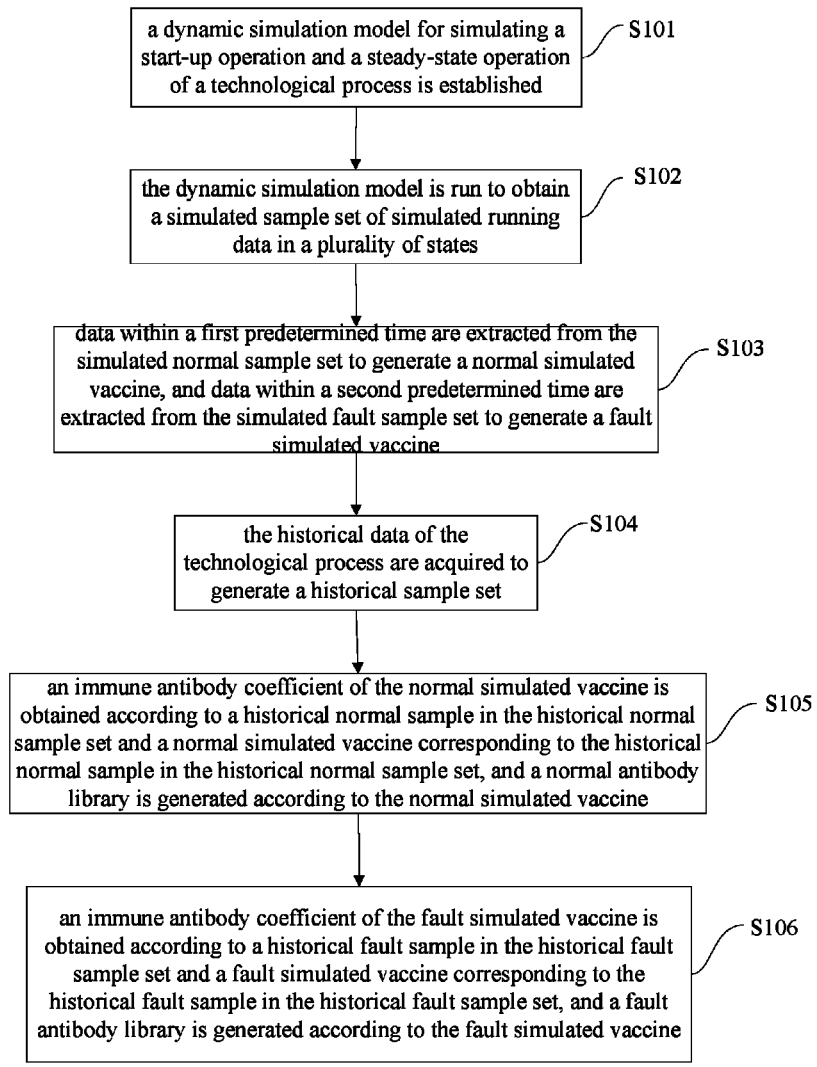
FIG. 1 is a flow chart of a fault diagnosing method based on a simulated vaccine according to an embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. In contrast, the present disclosure may include alternatives, modifications and equivalents within the spirit and scope of the appended claims. The same or similar elements and the elements having same or similar functions are denoted by like reference numerals throughout the descriptions. A plurality of particular details are illustrated for providing a comprehensive understanding of the subject matter proposed herein. However, it would be understood by those skilled in the art that the subject matter proposed herein may be implemented without using these particular details. In other cases, well-known methods, programs, components and circuits are not described in detail, thus avoiding the unnecessary obscuring of aspects of embodiments.

Although terms such as "first" and "second" are used herein for describing various elements, these elements should not be limited by these terms. These terms are only used for distinguishing one element from another element. For example, a first sequencing criterion may also be called a second sequencing criterion, and similarly, the second sequencing criterion may also be called the first sequencing criterion, without departing from the scope of the present disclosure. The first sequencing criterion and the second sequencing criterion are both a sequencing criterion, but are not the same sequencing criterion.

Terms used herein in the description of the present disclosure are only for the purpose of describing specific embodiments, but should not be construed to limit the present disclosure. As used in the description of the present disclosure and the appended claims, "a" and "the" in singular forms mean including plural forms, unless clearly indicated in the context otherwise. It should also be understood that, as used herein, the term "and/or" represents and contains any one and all possible combinations of one or more associated listed items. It should be further understood that, when used in the specification, terms "comprising" and/or "containing" specify the presence of stated features, operations, elements and/or components, but do not exclude the presence or addition of one or more other features, operations, elements, components and/or groups thereof.

As used herein, depending on the context, the term "if" may be understood to mean "when" or "upon" or "in response to the determination of" or "according to the determination of" or "in response to the detection of", a precondition stated being true. Similarly, according to the context, the phrase "if it is determined that [a precondition stated is true]" or "if [a precondition stated is true]" or "when [a precondition stated is true]" may be understood to mean "when determining" or "in response to the determination of" or "according to the determination of" or "corresponding to the detection of", a precondition stated being true.

The fault diagnosing method based on the simulated vaccine according to an embodiment of the present disclosure will be described below with reference to the drawings. It should be noted that, the fault diagnosing method based on the simulated vaccine according to an embodiment of the present disclosure is achieved by using an artificial immune system.

A technological process may include, but is not limited to, a chemical process, a refining process and a biopharmaceutical process. Accordingly, with the fault diagnosing method based on the simulated vaccine according to an embodiment of the present disclosure, a fault in the above technological process may be detected accurately and rapidly, and the type of the fault may be determined.

Specifically, referring to FIG. 1, the fault diagnosing method based on the simulated vaccine according to an embodiment of the present disclosure comprises the following steps.

Step S101, a dynamic simulation model for simulating a start-up operation and a steady-state operation of a technological process is established according to process information, an operating procedure and historical data of the technological process. The process information may include, but is not limited to, a process flow chart, a material state, operating parameters, controller settings and environmental parameters.

Figure 2:
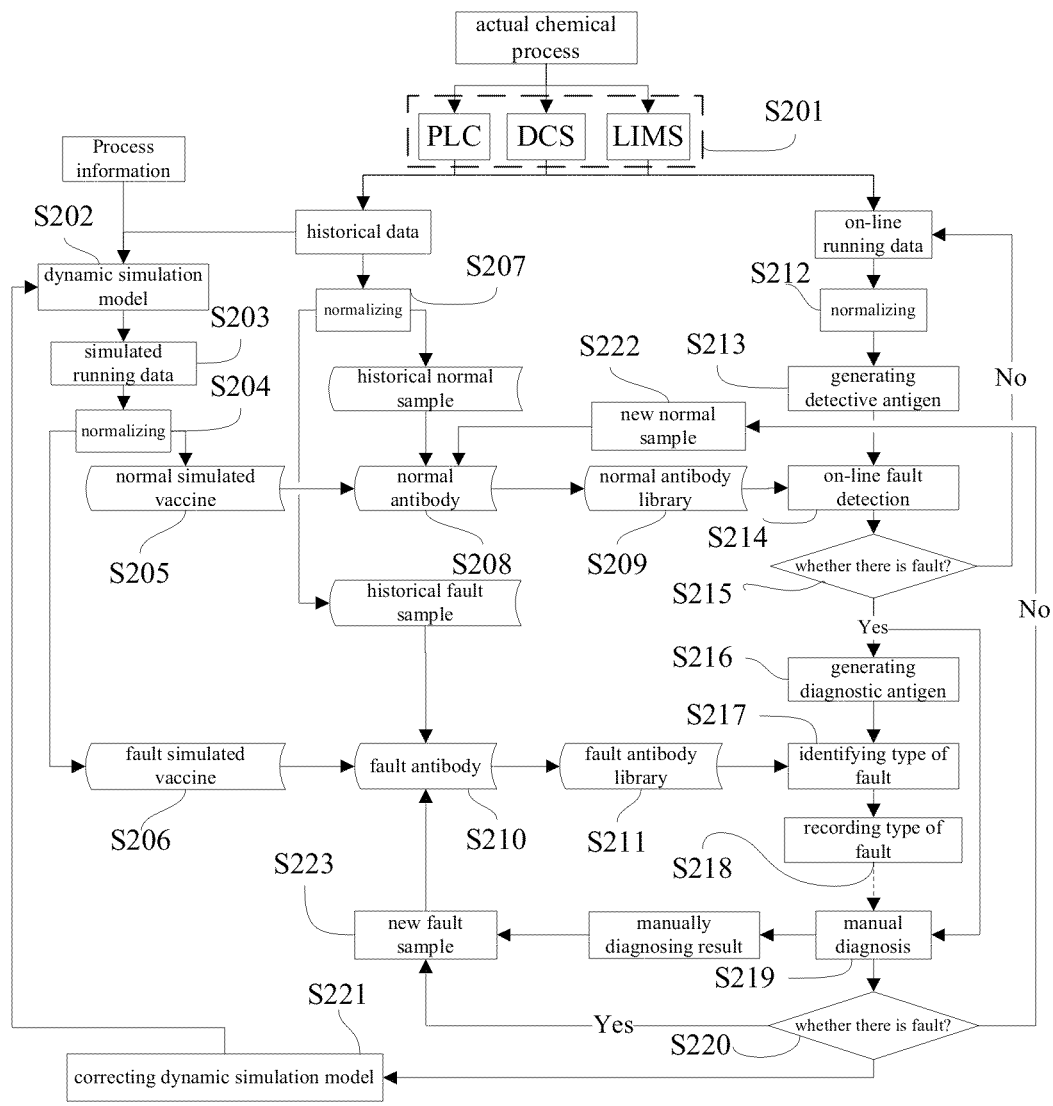
FIG. 2 is a detailed flow chart of a fault diagnosing method based on a simulated vaccine according to an embodiment of the present disclosure.

Specifically, referring to FIG. 2, according to known process information such as a process flow chart, a material state, operating parameters, controller settings and environmental parameters of the technological process, in Step S202, the dynamic simulation model is established by process simulation software or by a differential equation. For example, a dynamic simulation model of the technological process is established by process simulation software such as UniSim, Aspen Dynamics, DynSim or ChemCad. Certainly, in other examples, a specific dynamic mathematical model (i.e., a dynamic simulation model) may be established using a mathematical method such as a method of establishing a differential equation according to process simulation knowledge and related information and data. Further, referring to FIG. 2, in Step S201, the historical data of the technological process may be acquired, and the dynamic simulation model is corrected according to the historical data of the technological process, that is, the historical data of the technological process are acquired to help to correct the established dynamic simulation model, until simulated data generated by running the dynamic simulation model coincide with the historical data of the technological process.

Step S102, the dynamic simulation model is run to obtain a simulated sample set of simulated running data in a plurality of states, in which the simulated sample set has various types of simulated samples and comprises a simulated normal sample set and a simulated fault sample set, the simulated normal sample set comprises simulated data sample sets obtained during a normal start-up operation and during a normal steady-state operation, and the simulated fault sample set comprises fault data sample sets corresponding to a plurality of faults generated during the start-up operation and during the steady-state operation. Specifically, referring to FIG. 2, after an accurate dynamic simulation model is established in Step S202, in Step S203, the dynamic simulation model is run, that is, the dynamic simulation model is run to generate the simulated sample set of the simulated running data in a plurality of states (one simulated sample set in one state), and the generated simulated data (i.e., the simulated sample set) are saved.

More specifically, a disturbance within a normal operating range is added to the dynamic simulation model to generate the simulated normal sample set when the dynamic simulation model is run. That is, according to an operating manual or according to a practical situation, the disturbance within the normal operating range comprising a gradual change in environmental parameters, a suitable noise and an adjustment of operating parameters within an allowable range is added, so as to obtain the simulated normal sample set.

A fault disturbance is added to the dynamic simulation model to generate the simulated fault sample set when the dynamic simulation model is run. That is, according to an operating manual or according to a practical situation, a disturbance outside the normal operating range comprising a change in environmental parameters beyond an operating range, a change in a controller and a closing of some valves is added, so as to obtain the simulated fault sample set corresponding to various types of faults. In this embodiment, each of the disturbance within the normal operating range and the fault disturbance may include, but is not limited to, environmental parameters, a noise and operating parameters.

It should be noted that before each simulated datum in a set of the simulated running data is processed, the each simulated datum in the set of the simulated running data should be normalized. Specifically, as shown in FIG. 2, in Step S204, the each simulated datum in the set of the simulated running data generated in Step S203 is normalized by a following formula to obtain the simulated sample set:

$$X = 0.5 + \frac{x - \overline{X}}{X_{max} - X_{min}}$$

where x is a simulated datum of a variable in a simulated sample, $\overline{X}$ is an average value of historical data of the variable x under an actual normal operating condition, and $X_{max}$ and $X_{min}$ are a maximum value and a minimum value of the historical data of the variable x under the actual normal operating condition respectively.

Step S103, data within a first predetermined time are extracted from the simulated normal sample set to generate a normal simulated vaccine, and data within a second predetermined time are extracted from the simulated fault sample set to generate a fault simulated vaccine. As a particular example, the following operation is performed for the simulated normal sample set obtained after the each simulated datum in the set of the simulated running data is normalized in Step S204, so as to obtain the normal simulated vaccine. Specifically, referring to FIG. 2, in Step S205, a normal operation comprises a normal steady-state operation and a normal start-up operation, data fragments within a first predetermined time (e.g., a time sequence with a fixed time length during the normal steady-state operation or a time sequence during the normal start-up operation) are extracted from the simulated normal sample set to generate normal simulated vaccines in different periods, and the normal simulated vaccines are recorded as $V_N=[V_{N1}, V_{N2}, \ldots, V_{Nn}]$, where $V_{Ni}$ is a simulated data time sequence of a variable i, and n is a total number of variables.

Similarly, the following operation is performed for the simulated fault sample set obtained after the each simulated datum in the set of the simulated running data is normalized in Step S204, so as to obtain the fault simulated vaccine. Specifically, referring to FIG. 2, in Step S206, the following operation is performed for each type of fault: a data fragment within a fixed time length after a time when a fault is introduced is extracted to generate a fault simulated vaccine, and the fault simulated vaccine is recorded as $V_S=[V_{S1}, V_{S2}, \ldots,$ $V_{Sn}]$, where $V_{Si}$ a simulated data time sequence of a variable i after a faults is introduced, and n is a total number of variables.

Step S104, the historical data of the technological process are acquired to generate a historical sample set comprising a historical normal sample set and a historical fault sample set. That is, the historical sample set is obtained by a DCS, etc. of an actual device. Referring to FIG. 2, in Step S201, the historical data of the technological process are acquired to generate the historical sample set. The historical sample set comprises various types of historical samples. In the above embodiment, the historical normal sample set comprises historical data sample sets obtained during the normal steady-state operation and during the normal start-up operation, and the historical fault sample set comprises fault data sample sets corresponding to a plurality of faults actually generated during the steady-state operation and during the start-up operation. Referring to FIG. 2, in Step S207, the normalizing is performed by a following formula:

$$X = 0.5 + \frac{x - \overline{X}}{X_{max} - X_{min}}$$

where x is a historical datum of a variable in a historical sample, $\overline{X}$ is an average value of historical data of the variable x under an actual normal operating condition, and $X_{max}$ and $X_{min}$ are a maximum value and a minimum value of the historical data of the variable x under the actual normal operating condition respectively.

Step S105, an immune antibody coefficient of the normal simulated vaccine is obtained according to a historical normal sample in the historical normal sample set and a normal simulated vaccine corresponding to the historical normal sample in the historical normal sample set, and a normal antibody library is generated according to the normal simulated vaccine. That is, the immune antibody coefficient of the normal simulated vaccine is obtained according to a historical normal sample and a normal simulated vaccine corresponding to the historical normal sample, and the normal antibody library is generated according to the normal simulated vaccine. Specifically, referring to FIG. 2, in Step S208, for each historical normal sample set comprising historical data sample sets obtained during the normal start-up operation and during the normal steady-state operation, a simulated sample under a condition (comprising operating parameters, environmental parameters, a material property, etc.) completely identical with that of a known historical sample is taken from the simulated normal sample set. The historical sample is recorded as $H=[H_1, H_2, \ldots, H_n]$, and the simulated sample is recorded as $V=[V_1, V_2, \ldots, V_n]$. The immune antibody coefficient of the normal simulated vaccine representing a relation between actual data and simulated data is calculated by a formula (1):

$$Rt = [Rt_1, Rt_2, \ldots, Rt_n] = \left[\frac{|H_1|}{|V_1|}, \frac{|H_2|}{|V_2|}, \ldots, \frac{|H_n|}{|V_n|}\right]. \quad (1)$$

Two samples are randomly taken from the normal simulated vaccine, and a large number of normal antibodies are generated by a formula (2):

$$Ab_{normal}=Rt(aX_c+b(X_c-X_d)) \quad (2)$$

where $X_i$ is a normal simulated vaccine of the same type (since a normal sample obtained during the normal start-up operation and a normal sample obtained during the normal steady-state operation are of two types), $Ab_{normal}$ is a generated normal antibody, a is a random decimal within a range from 0.5 to 2, b is a random decimal within a range from −1 to 1, and c and d are two unequal sequence numbers of normal simulated vaccines randomly selected.

Two normal antibody libraries are generated during the normal start-up operation and during the normal steady-state operation respectively and applied to fault detection during the start-up operation and during the steady-state operation respectively.

Step S106, an immune antibody coefficient of the fault simulated vaccine is obtained according to a historical fault sample in the historical fault sample set and a fault simulated vaccine corresponding to the historical fault sample in the historical fault sample set, and a fault antibody library is generated according to the fault simulated vaccine. Specifically, referring to FIG. 2, in Step S210, for each historical fault sample set comprising fault data sample sets corresponding to a plurality of faults generated during the start-up operation and during the steady-state operation, a simulated sample under a condition (comprising operating parameters, environmental parameters, a material property, etc.) completely identical with that of a known historical sample is taken from the simulated fault sample set. A data fragment of the historical fault sample after a fault is introduced is recorded as $H_F^{n \times m}$, and the fault simulated vaccine under a condition (comprising operating parameters, environmental parameters, a material property, the type, introduction time and amplitude of the fault, etc.) identical with that of the historical fault sample is recorded as $V_F^{n \times m}$, where n is a number of variables, and m is a number of sampling points.

For a fault generated during the start-up operation, a normal start-up historical sample $H_N^{n \times l}$ under a condition (comprising operating parameters, environmental parameters, a material property, a start-up operation time, etc.) similar to that of $H_F^{n \times m}$ is taken, where n is a number of variables, and l is a number of sampling points. A minimum difference degree matrix between a fault start-up historical sample and a normal start-up historical sample, i.e., a deviation matrix between a fault sample and a normal sample, is calculated by a DTW (dynamic time warping) algorithm. In other examples, a historical deviation matrix may also be calculated by a formula (3):

$$\phi_H^{n \times m} = [H_F(1) - H_N(k); H_F(2) - H_N(k+1); \ldots, H_F(m) - H_N(k+m-1)] \quad (3)$$

where k is a sequence number of a sampling point of a normal start-up historical sample, in which a difference degree of data of the sampling point of the normal start-up historical sample and data of a sampling point at a moment when a fault is introduced is minimum.

Then, a normal start-up simulated sample $V_N^{n \times l}$ under a condition (comprising operating parameters, environmental parameters, a material property, a start-up operation time, etc.) identical with that of $V_F^{n \times m}$ is taken, where n is a number of variables, and l is a number of sampling points. A minimum difference degree matrix between a simulated fault start-up historical sample and a normal start-up historical sample, i.e., a deviation matrix between a fault sample and a normal sample, is calculated by a DTW algorithm. In other examples, a simulated deviation matrix may also be calculated by a formula (4):

$$\phi_v^{n \times m} = [V_F(1) - V_N(k); V_F(2) - V_N(k+1); \ldots, V_F(m) - V_N(k+m-1)] \quad (4)$$

where k is a sequence number of a sampling point of a normal start-up historical sample, in which a difference degree of data of the sampling point of the normal start-up historical sample and data of a sampling point at a moment when a fault is introduced is minimum.

The minimum difference degree matrix between the fault start-up historical sample and the normal start-up historical sample calculated in this way may represent a deviation between fault data and normal data during the start-up operation under an actual operating condition and in a simulation model.

For a fault generated during the steady-state operation, a minimum difference degree matrix may not need to be calculated using a normal data sample to obtain a fault deviation. A historical fault deviation matrix during the steady-state operation is calculated by a formula (5), that is, the historical fault deviation matrix is obtained by subtracting a datum of a sampling point (i.e., a first sampling point) obtained when a fault is introduced from the datum of each sampling point of a historical fault data fragment:

$$\phi_v^{n \times m} = [H_F(1) - H_F(1); H_F(2) - H_F(1); \ldots, H_F(m) - H_F(1)] \quad (5)$$

A simulated fault deviation matrix during the steady-state operation is calculated by a formula (6), that is, the simulated fault deviation matrix is obtained by subtracting a datum of a sampling point (i.e., a first sampling point) obtained when a fault is introduced from the datum of each sampling point of a fault simulated vaccine:

$$\phi_v^{n \times m} = [V_F(1) - V_F(1); V_F(2) - V_F(1); \ldots, V_F(m) - V_F(1)] \quad (6)$$

After the historical fault deviation matrix and the simulated fault deviation matrix corresponding to the historical fault deviation matrix are calculated, for each type of fault (since faults generated during the start-up operation and during the steady-state operation are of different types), the immune antibody coefficient of the fault simulated vaccine representing a relation between an actual fault deviation and a simulated fault deviation is calculated by a formula (7):

$$Rt = [Rt_1, Rt_2, \ldots, Rt_n] = \left[ \frac{|\varphi_{H1}|}{|\varphi_{V1}|}, \frac{|\varphi_{Hn}|}{|\varphi_{Vn}|}, \ldots, \frac{|\varphi_{Hn}|}{|\varphi_{Vn}|} \right]. \quad (7)$$

Figure 3:
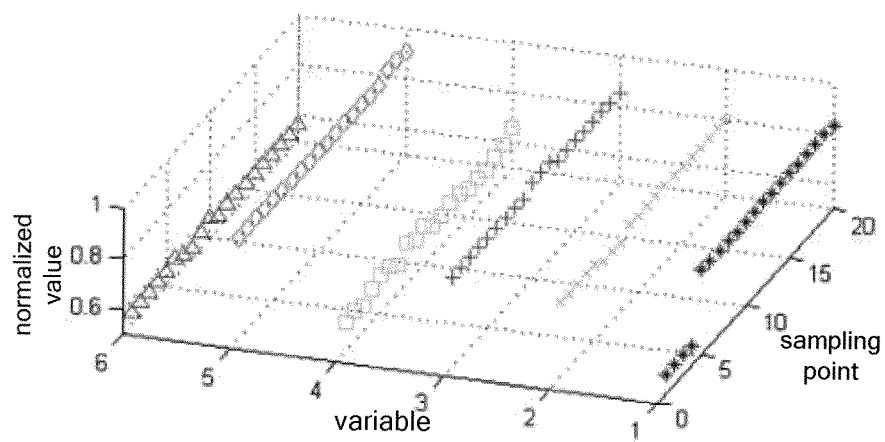
FIG. 3 is a schematic diagram of a structure of an antibody/antigen of a fault diagnosing method based on a simulated vaccine according to an embodiment of the present disclosure.

Two samples are randomly taken from a set of fault simulated vaccines of each fault type, two deviation matrixes are calculated by the DTW algorithm or by the formula (4) for the faults generated during the start-up operation, and two deviation matrixes are calculated by the DTW algorithm or by the formula (6) for the faults generated during the steady-state operation. A large number of fault antibodies are generated by a formula (8) to constitute the fault antibody library:

$$Ab_{fault} = Rt(a\phi_c + b(\phi_c - \phi_d)) \quad (8)$$

where $\phi_i$ is a deviation matrix calculated for a fault simulated vaccine of the same type (since a fault sample obtained during the start-up operation and a fault sample obtained during the steady-state operation are of two types), $Ab_{fault}$ is a generated fault antibody, a is a random decimal within a range from 0.5 to 2, b is a random decimal within a range from −1 to 1, c and d are two unequal sequence numbers of fault simulated vaccines randomly selected, and Rt is the immune antibody coefficient of the fault simulated vaccine calculated hereinabove. For a fault type without a historical fault sample, Rt=1. Referring to FIG. 3, a variable 1 to a variable 6 are deviation values corresponding to 6 different variables generated during the production of a manufacturing apparatus respectively.

In one embodiment, after a large number of normal antibodies and a large number of fault antibodies are obtained, the fault diagnosing method based on the simulated vaccine according to an embodiment of the present disclosure further comprises: saving the antibodies of the same type in one antibody library to generate a normal antibody library and a fault antibody library respectively, and then obtaining the threshold of each antibody library by a time-based dynamic warping algorithm DTW or by a difference degree calculating formula.

Specifically, referring to FIG. 2, in Steps S209 and S211, all normal antibodies generated by the normal simulated vaccine are saved in a normal antibody library, and all fault antibodies generated by the fault simulated vaccine are saved in a fault antibody library, in which two normal antibody libraries generated during the normal start-up operation and during the normal steady-state operation are established, one fault antibody library is established for each type of fault, and two fault antibody libraries are established for the same type of fault which may appear during the start-up operation and during the steady-state operation. For a determinate normal antibody/fault antibody, a minimum difference degree matrix between a fault start-up historical sample and a normal start-up historical sample is calculated by the DTW algorithm, that is, a difference degree between every two antibodies of the same type in the same type of antibody set is calculated by the DTW algorithm. In other examples, the difference degree between every two antibodies of the same type in the same type of antibody set may also be calculated by a formula (9):

$$\eta = \frac{\min_{1 \leq k \leq m-n} \left( \sum_{i=k}^{n+k-1} |Ab(k) - Ag(i)| \right)}{n} \quad (9)$$

where Ab is a longer antibody (i.e., an antibody in which a number of sampling points is larger); m is a length of Ab, i.e., a number of sampling points; Ag is a shorter antibody (i.e., an antibody in which a number of sampling points is smaller) or antigen; n is a length of Ag, i.e., a number of sampling points; and k is a sequence number of a sampling point of an antibody from 1 to m−n.

For each independent antibody library, a difference degree between every two antibodies of the same type in an antibody library of a sample type k (which may be obtained during the normal start-up operation or during normal steady-state operation or may be corresponding to various types of faults) is calculated and recorded as $\eta_k(i, j)$, and the threshold (i.e., a maximum difference degree value meeting a feature of an antibody in the antibody library) of each antibody library is calculated by a formula (10):

$$threshold_k = \max_{1 \leq i \leq n} \min_{1 \leq j \leq n, i \neq j} |\eta_k(i, j)| \quad (10)$$

where $\eta_k(i, j)$ is a difference degree value between an $i^{th}$ antibody and a $j^{th}$ antibody in an antibody library of a type k.

After the normal antibody library, the fault antibody library and the threshold of each antibody library are obtained, running data during the running of the technological process should be obtained, so as to perform a calculation according to the running data and to determine whether there is a fault in the technological process and determine the type of the fault. Running data during the running of the technological process are obtained by the following steps:

1) running an actual technological process to obtain a sample of on-line running data; and
2) extracting a data fragment set within a predetermined time range before a current moment, that is, extracting a data fragment set within a predetermined time range before a current moment from the sample of the on-line running data.

Further, the fault diagnosing method based on the simulated vaccine according to an embodiment of the present disclosure further comprises: normalizing the sample of the on-line running data. Specifically, referring to FIG. 2, after normalizing the sample of the on-line running data in Step S212, on-line production data of the technological process are obtained. In Step S213, a data fragment (i.e., the data fragment set within the predetermined time range) with a fixed time length before a detection moment is recorded as $C^{n \times m} = [C_1, C_2, \ldots, C_n]$, where $C_i$ is a value of a variable i in a period of time before the current moment, n is a number of variables, and m is a number of sampling points. During the process of detecting a fault, a detective antigen is directly recorded as an on-line data fragment before the current moment, that is, Ag=C. In this embodiment, the predetermined time range before the current moment is determined by an empirical value.

After the detective antigen is generated, in Step S214, an on-line fault detection is performed to calculate a difference degree of the detective antigen and each normal antibody in the normal antibody library by the DTW algorithm or by the formula (9). If a difference degree of the detective antigen and a normal antibody is less than the threshold of the normal antibody library, it is determined that the technological process is normal. If the difference degree of the detective antigen and each normal antibody in the normal antibody library are larger than the threshold of the normal antibody library, it is determined that there is a fault in the technological process. Specifically, the on-line fault detection in Step S214 comprises:

calculating a difference degree of an antigen at the current moment and each normal antibody in the normal antibody library to obtain a difference degree set; and determining whether each difference degree in the difference degree set is less than a threshold of the normal antibody library, and if yes, determining that the technological process is normal, otherwise, determining that there is a fault in the technological process.

During the above process of detecting the fault, if the actual technological process is in a start-up state, the normal antibody library is a start-up normal antibody library; and if the actual technological process is in a steady-state operation state, the normal antibody library is a steady-state operation normal antibody library.

In one embodiment, after the on-line fault detection in Step S214 is completed, in Step S215, a detection result is judged, and if the detection result is normal, normal is indicated in a user interface.

Further, after it is determined that there is a fault in the technological process, a type of the fault in the technological process is determined, that is, a diagnostic antigen is generated and the type of the fault in the technological process is determined using the threshold of the fault antibody library. Specifically, the type of the fault in the technological process is determined by the following steps.

1) A datum of a first sampling point of a detective antigen obtained at a fault detecting moment is recorded as $D^{n \times 1} = [D_1, D_2, \ldots, D_n]$. Referring to FIG. 2, in Step S216, for the start-up operation, normal start-up sample data of a normal start-up historical sample $H_N^{n \times l}$ under a condition (comprising operating parameters, environmental parameters, a material property, a start-up operation time, etc.) similar to a current operating condition are acquired, and a deviation matrix is calculated by the DTW algorithm or by a first predetermined formula, i.e., a formula (11) as a diagnostic antigen:

$$Ag=[C(1)-H_N(k);C(2)-H_N(k+1);\ldots,C(m)-H_N(k+m-1)] \quad (11)$$

where k is a sequence number of a sampling point of a normal start-up historical sample, in which a difference degree of data of the sampling point of the normal start-up historical sample and a datum D obtained at a fault detecting moment is minimum.

For the steady-state operation, a value of each sampling point in a fragment of the on-line running data is acquired, and a datum D obtained at a moment when a fault is detected is subtracted from the value of each sampling point to obtain a diagnostic antigen, that is, $Ag=[Ag_1, Ag_2, \ldots, Ag_n]=[C_1-D_1, C_2-D_2, \ldots, C_n-D_n]$. It should be noted that the format of the above diagnostic antigen is the same as that of an antibody in an antibody library, each of the diagnostic antigen and the antibody is a matrix consisting of time sequence data samples, and $Ag_i$ is a time sequence by which a value of each variable under a current operating condition is deviated from the value of each variable under a normal operating condition.

2) After the diagnostic antigen is generated, in Step S217, a difference degree of a diagnostic antigen at the current moment and each fault antibody in the fault antibody library is calculated by the DTW algorithm or by a second predetermined formula, i.e., the formula (9). The difference degree of the diagnostic antigen at the current moment and each fault antibody is compared with the threshold of the fault antibody library.

3) If the difference degree of the diagnostic antigen at the current moment and one fault antibody is less than the threshold of the fault antibody library, it is determined that the fault of the technological process is of a corresponding fault type.

In one embodiment, after identifying the type of the fault in Step S217, in Step S218, the possible type of the fault is indicated in a user interface to help a user to observe the type of the fault, so as to repair the fault in the technological process according to the type of the fault. That is, referring to a fault diagnosing result obtained in Step S218, an operator may perform a manual diagnosis (e.g., Step S219), and select an exact type of the fault in the user interface in Step S218. Meanwhile, the user interface also has a manual input function. Therefore, when the possible type of the fault in the technological process is not determined or all determining results are incorrect, the operator may manually input the type of the fault.

After the above fault determining, the fault diagnosing method based on the simulated vaccine according to an embodiment of the present disclosure further comprises: updating an antibody in a corresponding antibody library by the on-line running data according to a comparison between an on-line antigen and the normal antibody library and a comparison between the on-line antigen and the fault antibody library. Specifically, a manually diagnosing result confirmed in Step S219 is judged in Step 220. Firstly, in Step S221, according to a diagnosing result, the dynamic simulation model is corrected using data obtained after a fault is detected. If the diagnosing result is normal, Step S222 is executed, and a data fragment from a moment when a fault is detected to the current moment constitutes a fragment of the historical normal sample in Step S105. If the diagnosing result is that there is a fault, Step S223 is executed, a data fragment from the moment when the fault is detected to the current moment constitutes a fragment of the historical fault sample in Step S106, and a fault deviation matrix is calculated. The corrected dynamic simulation model is used to generate new simulated data, a sample of the new simulated data is used to update an immune antibody coefficient of a simulated vaccine, and a large number of new immune antibody coefficients updating the simulated vaccine using the simulated data samples are generated. A large number of new simulated vaccines are generated by the corrected dynamic simulation model. Steps S102 to S106 are repeated, new antibodies are generated, the normal antibody library and the fault antibody library are updated, and the threshold of each antibody library is recalculated.

Embodiment

Figure 4:
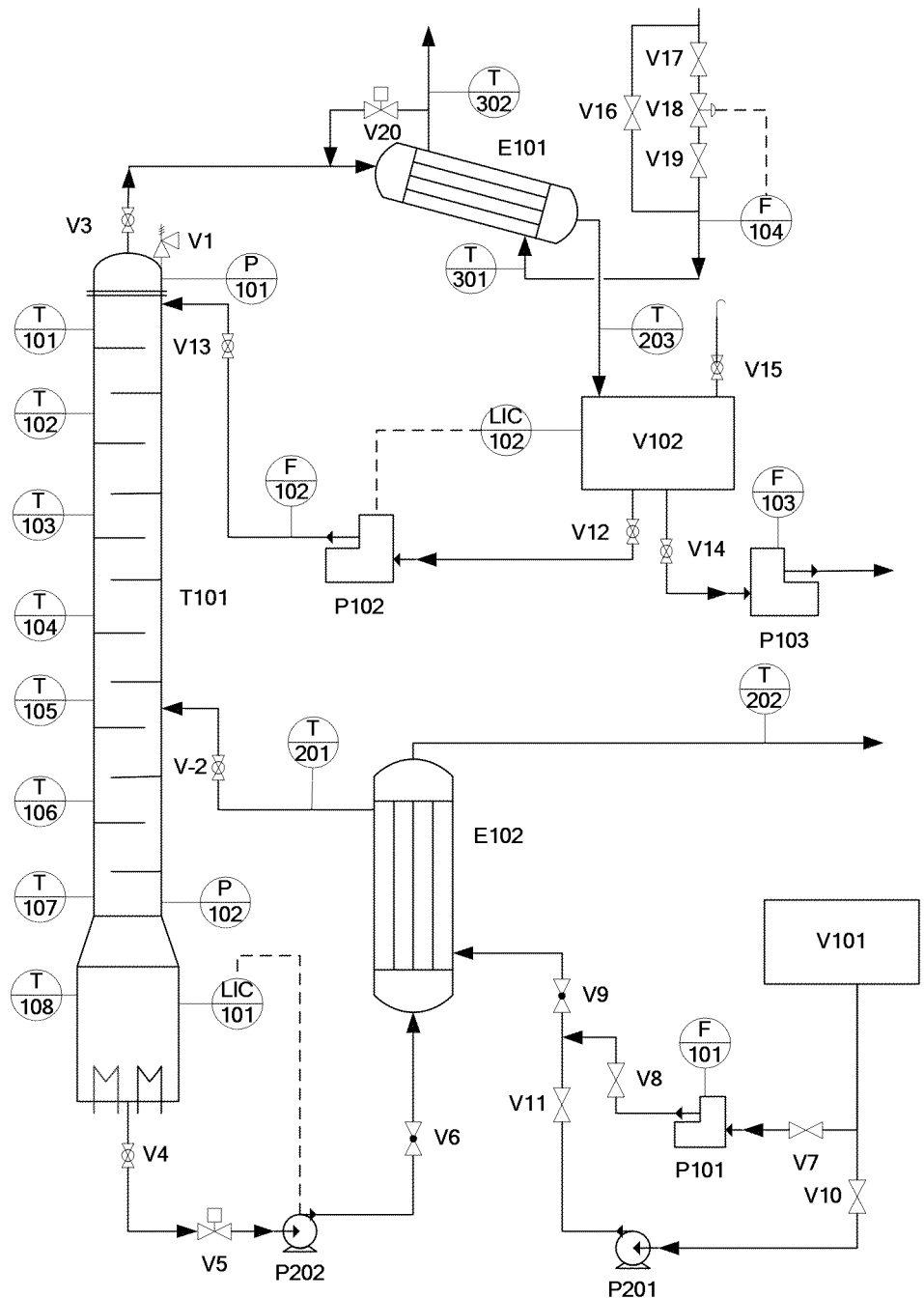
FIG. 4 is a schematic diagram of a technological process of a rectifying column system using a fault diagnosing method based on a simulated vaccine according to an embodiment of the present disclosure.

FIG. 4 is a schematic diagram of a technological process of a rectifying column system using a fault diagnosing method based on a simulated vaccine according to an embodiment of the present disclosure. That is, the technological process of the rectifying column system is taken as an example.

Referring to FIG. 4, in this embodiment, a rectifying column is a sieve-plate column comprising 15 column plates, and a feed inlet is located in a twelfth column plate. The rectifying column has a height of 2.2 meters and a diameter of 7.5 cm. The rectifying column system is mainly used for the separation of an ethanol-water system. One DCS is configured to ensure the stable and safe running of a device and to acquire data for a fault diagnosis. Data of 21 measured variables may be acquired by the DCS for being used for the fault diagnosis. The 21 measured variables comprise 13 temperatures, 2 pressures, 4 flow rates and 2 liquid levels. The 13 temperatures comprise column plate temperatures TI101-TI108, a feeding temperature TI201, a column bottom liquid outlet temperature TI202, a reflux accumulator inlet temperature TI203, a condensed water inlet temperature TI301 and a condensed water outlet temperature TI302. The 2 pressures comprise a column top pressure PI101 and a column bottom pressure PI102. The 4 flow rates comprise a feeding flow rate FI101, a reflux flow rate FI102, a column top product sampling flow rate FI103 and a condensed water flow rate FI104. The 2 liquid levels comprise a column bottom liquid level LI101 and a reflux accumulator liquid level LI102.

In this example, there are two PID (proportional integral derivative) controllers LIC101 and LIC102 in the technological process of the rectifying column system. The PID controller LIC101 is configured to control the column bottom liquid level LI101 by changing a frequency of a column bottom tail pump. The PID controller LIC102 is configured to control the liquid level LI102 of a reflux accumulator V102 by changing the flow rate FI102 of a reflux metering pump P102.

A standard start-up operation time of the rectifying column system is 2000 s. Before the start-up operation, except condensed water valves V-17, V-19 and a vent valve V-15, all other valves are in a closed state. Particular steps of the start-up operation are shown in Table 1.

TABLE 1

| Step | Procedure |
|------|-----------|
| 1 | Opening valves V-2, V-3, V-9, V-10, V-11, and adding an ethanol-water solution with a volume fraction of 30% into a column bottom using a full-speed feed pump P201 under normal temperature and pressure conditions |

TABLE 1-continued

| Step | Procedure |
|---|---|
| 2 | When the column bottom liquid level exceeds 27.5 cm, closing the full-speed feed pump P201 and the valves V-10, V-11, heating the column bottom with a load of 100%, setting a condensed water controller to manual, and adjusting an opening of a valve V-18 to make a flow rate larger than 300 L/h |
| 3 | When a second column plate temperature TI102 reaches 70° C., reducing a heating load of the column bottom to 60%, opening valves V-12, V-13, setting a reflux accumulator liquid level controller LIC102 to automatic, and setting an SV value of the reflux accumulator liquid level controller LIC102 to 4 cm |
| 4 | When the reflux accumulator liquid level is substantially stable, opening valves V-4, V-5, V-6, V-7, V-8, starting a feed metering pump, setting a feeding flow rate to 10 L/h, setting a column bottom liquid level controller LIC101 to automatic, and setting an SV value of the column bottom liquid level controller LIC101 to 25 cm |
| 5 | When the column bottom liquid level is substantially stable, opening a valve V-14, starting a product metering pump, starting a reflux ratio controller, and setting a reflux ratio to 2 |

After the start-up operation is completed, main operating parameters and control targets of controllers during the steady-state operation are shown in Table 2. Table 2 shows parameter settings under a normal operating condition.

TABLE 2

| | Parameter | Variable symbol | Value | Unit |
|---|---|---|---|---|
| Operating parameter | Column bottom heating power | W | 15.0 ± 0.5 | kw |
| | Operating pressure | PI101 | 1 | atm |
| | Feed ethanol concentration | C1 | 30 ± 1 | v/v % |
| | Feeding flow rate | FI101 | 10.0 | L/h |
| | Condensed water flow rate | FI104 | 320.0 ± 10 | L/h |
| | Reflux ratio | R | 0.5, 1, 2, 4 | 1 |
| Control target | Column bottom liquid level | LI101 | 35 | cm |
| | Reflux accumulator liquid level | LI102 | 4 | cm |

When a fault diagnosis needs to be performed for the rectifying column system, referring to FIG. 2, firstly, in Step S201, historical data of 21 measured variables are acquired by the DCS, and a sampling time interval is 1 second. In other examples, the historical data may also be acquired by other systems such as a system directly connected with a manufacturing apparatus, for example, in Step S201, required process variable data and data obtained by a dynamic simulation may be acquired by PLC (programmable logic controller), LIMS (laboratory information management system), etc.

Figure 5:
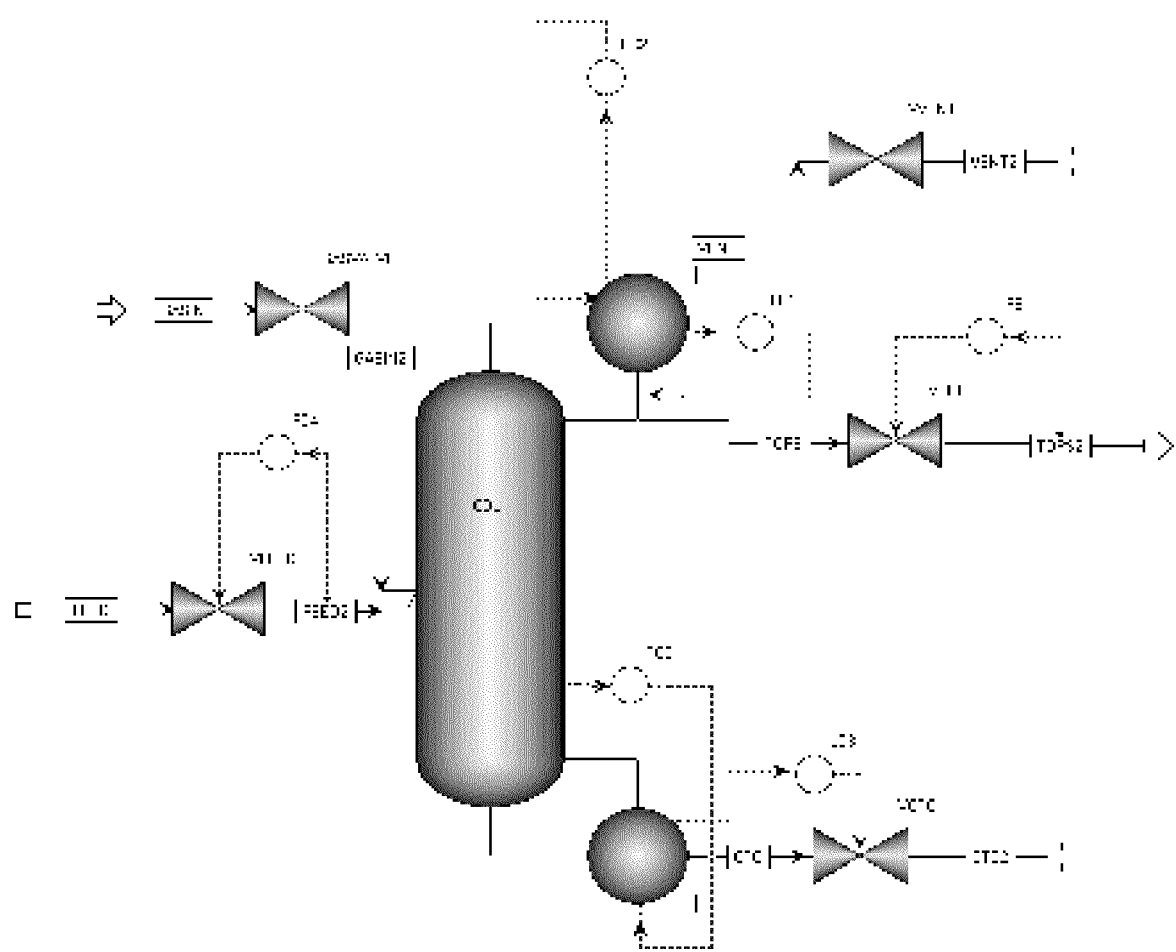
FIG. 5 is a schematic diagram of a dynamic model established according to the technological process of the rectifying column system shown in FIG. 4.

Step S202 is executed, and referring to process information and the historical data obtained in Step S201, for example, Aspen Dynamic is used for establishing a dynamic rectifying column system model (i.e., a dynamic simulation model) such as a dynamic model shown in FIG. 5. The dynamic model may simulate the start-up operation and the steady-state operation of the rectifying column system.

In Step S203, according to the parameter settings under the normal operating condition, during the running of the dynamic model, some disturbances (comprising a step type disturbance and a gradually changed disturbance) are added to the operating parameters during the start-up operation and during the steady-state operation respectively, a disturbance of an environmental temperature or pressure is added according to a practical situation, and finally a suitable noise is added according to actual historical data to generate a normal sample. After the normalizing in Step S204, in Step S205, 50 historical normal start-up operation data fragments with a length of 2000 s and 50 steady-state operation data fragments with a length of 60 s are extracted to generate a normal simulated vaccine. In Step S208, one historical normal sample with a length of 2000 s obtained during the start-up operation after the normalizing in Step S207 and one historical normal sample with a length of 60 s obtained during the steady-state operation after the normalizing in Step S207 are taken. Simulated data under conditions completely identical with those of the above two historical normal samples are generated by the dynamic simulation model, and immune antibody coefficients of the normal simulated vaccines during the start-up operation and during the steady-state operation are calculated respectively. Then, normal antibodies are generated by performing a calculation for the normal simulated vaccines by formulas containing the immune antibody coefficients of the normal simulated vaccines. In Step S209, the above normal antibodies are saved in normal antibody libraries generated during the start-up operation and during the steady-state operation respectively, and the threshold of each normal antibody library is calculated.

In addition, during the running of the dynamic model, disturbances of stopping heating the column bottom and of reducing the condensed water flow rate are added during the start-up operation respectively, disturbances of closing a column top sampling valve and of excessively heating the column bottom are added during the steady-state operation respectively, and 5 fault samples are generated for each disturbance. After the normalizing in Step S204, in Step S206, a data fragment with a length of 60 s after a fault is introduced is randomly extracted to generate a fault simulated vaccine. In Step S210, one historical fault sample with a length of 60 s obtained after the disturbance of stopping heating the column bottom is added during the start-up operation after the normalizing in Step S207 and one historical fault sample with a length of 60 s obtained after the disturbance of closing the column top sampling valve is added during the steady-state operation after the normalizing in Step S207 are taken. Simulated data under conditions completely identical with those of the above two historical fault samples are generated by the dynamic simulation model, and immune antibody coefficients of the fault simulated vaccines obtained after the disturbance of stopping heating the column bottom is added during the start-up operation and obtained after the disturbance of closing the column top sampling valve is added during the steady-state operation are calculated respectively. Immune antibody coefficients of the fault simulated vaccines obtained after the disturbance of reducing the condensed water flow rate is added during the start-up operation and obtained after the disturbance of excessively heating the column bottom is added during the steady-state operation are set to 1. Then, fault antibodies are generated by performing a calculation for the fault simulated vaccines by formulas containing the immune antibody coefficients of the fault simulated vaccines. In Step S211, the above fault antibodies are saved in 4 fault antibody libraries respectively, and the threshold of each fault antibody library is calculated.

Then, fault detection and diagnosis are performed for real-time data obtained during the running of the rectifying column system after the real-time data are normalized in Step S212. In this example, 8 real-time data samples are used for verifying the fault diagnosing method based on the simulated vaccine according to an embodiment of the present disclosure.

Firstly, a sample 1 is taken as an example. The sample 1 is a normal start-up operating condition. After the normalizing in Step S212, in Step S213, a data fragment within a time range of 10 seconds before a current moment is used for generating a detective antigen. Then, Step S214 is executed to perform an on-line fault detection. A difference degree of an antigen generated during the entire start-up operation and a normal antibody is always less than a threshold of a normal antibody library generated during the start-up operation, and therefore it is determined by a detection result that the sample 1 is a normal operating condition. After the detection result is judged in Step S215, Step S218 is executed to indicate normal in a user interface.

Then, a sample 3 is taken as an example. The sample 3 is a fault of stopping heating the column bottom introduced in a period of time of 1000 s after the start-up operation is started. After the normalizing in Step S212, in Step S213, a data fragment within a time range of 10 seconds before a current moment is used for generating a detective antigen. Then, Step S214 is executed to perform an on-line fault detection. A difference degree of an antigen generated by each sampling point and a normal antibody before a moment which is 1012 s after the start-up operation is started is less than a threshold of a normal antibody library generated during the start-up operation. After a detection result is judged in Step S215, Step S218 is executed to indicate normal in a user interface. At the moment which is 1012 s after the start-up operation is started, a difference degree of the detective antigen and each normal antibody in the normal antibody library generated during the start-up operation is larger than the threshold of the normal antibody library generated during the start-up operation, and therefore it is determined that there is a fault. After a detection result is judged in Step S215, Step S216 is executed, and a deviation matrix is calculated according to the data fragment within a time range of 10 seconds before the current moment and normal sample data as a diagnostic antigen. Then, Step S217 is executed to identify the type of the fault, and a difference degree of the diagnostic antigen and each fault antibody in a fault antibody library generated during the start-up operation is calculated. If it is found that a difference degree of the diagnostic antigen and a fault antibody in a fault antibody library of stopping heating the column bottom is less than a threshold of the fault antibody library of this type (i.e., stopping heating the column bottom) and a difference degree of the diagnostic antigen and a fault antibody in a fault antibody library of another type is larger than a threshold of the fault antibody library of the another type, a diagnosing result is a fault of stopping heating the column bottom. The type of the fault is output in Step S218. After it is confirmed that a manually diagnosing result is a fault of stopping heating the column bottom in Step S219, the type of the fault may be selected and confirmed in an information exchange system in Step S220. Firstly, Step S221 is executed to correct the dynamic simulation model using fault data. After the judgment in Step S220, in Step S223, a new fault sample is generated by data obtained from the current moment to a moment which is 10 s before the fault is detected, and an immune antibody coefficient of a simulated vaccine of the fault is updated. Then, all initialization steps are repeated, antibodies of all types are updated, and the threshold of each antibody library is recalculated.

Then, a sample 7 is taken as an example. The sample 7 is a fault of closing the column top sampling valve introduced at a moment which is 161 s after the steady-state operation is started. After the normalizing in Step S212, in Step S213, a data fragment within a time range of 10 seconds before a current moment is used for generating a detective antigen. Then, Step S214 is executed to perform an on-line fault detection. A difference degree of an antigen generated by each sampling point and a normal antibody before a moment which is 173 s after the steady-state operation is started is less than a threshold of a normal antibody library generated during the steady-state operation. After a detection result is judged in Step S215, Step S218 is executed to indicate normal in a user interface. At the moment which is 173 s after the steady-state operation is started, a difference degree of the detective antigen and each normal antibody in the normal antibody library generated during the steady-state operation is larger than the threshold of the normal antibody library generated during the steady-state operation, and therefore it is determined that there is a fault. After a detection result is judged in Step S215, Step S216 is executed, and a deviation matrix is calculated according to the data fragment within a time range of 10 seconds before the current moment and data in the $10^{th}$ second before the current moment as a diagnostic antigen. Then, Step S217 is executed to identify the type of the fault, and a difference degree of the diagnostic antigen and each fault antibody in a fault antibody library generated during the steady-state operation is calculated. If it is found that a difference degree of the diagnostic antigen and a fault antibody in a fault antibody library of closing the column top sampling valve is less than a threshold of the fault antibody library of this type (i.e., closing the column top sampling valve) and a difference degree of the diagnostic antigen and a fault antibody in a fault antibody library of another type is larger than a threshold of the fault antibody library of the another type, a diagnosing result is a fault of closing the column top sampling valve. The type of the fault is output in Step S218. After it is confirmed that a manually diagnosing result is a fault of closing the column top sampling valve in Step S219, the type of the fault may be selected and confirmed in an information exchange system in Step S220. Firstly, Step S221 is executed to correct the dynamic simulation model using fault data. After the judgment in Step S220, in Step S223, a new fault sample is generated by data obtained from the current moment to a moment which is 10 s before the fault is detected, and an immune antibody coefficient of a simulated vaccine of the fault is updated. Then, all initialization steps are repeated, antibodies of all types are updated, and the threshold of each antibody library is recalculated.

All fault diagnosing results in this example are shown in Table 3.

TABLE 3

| Sequence number | Running stage | Fault type | Introduction time | Detection time | Diagnostic type |
|---|---|---|---|---|---|
| 1 | Start-up operation | Normal | — | — | Normal |
| 2 | Steady-state operation | Normal | — | — | Normal |
| 3 | Start-up operation | Stopping heating the column bottom | 1000 s | 1012 s | Stopping heating the column bottom |

TABLE 3-continued

| Sequence number | Running stage | Fault type | Introduction time | Detection time | Diagnostic type |
|---|---|---|---|---|---|
| 4 | Start-up operation | Stopping heating the column bottom | 1300 s | 1315 s | Stopping heating the column bottom |
| 5 | Start-up operation | Low condensed water flow rate | 1400 s | 1412 s | Low condensed water flow rate |
| 6 | Start-up operation | Low condensed water flow rate | 900 s | 914 s | Low condensed water flow rate |
| 7 | Steady-state operation | Closing the column top sampling valve | 161 s | 173 s | Closing the column top sampling valve |
| 8 | Steady-state operation | Closing the column top sampling valve | 145 s | 161 s | Closing the column top sampling valve |
| 9 | Steady-state operation | Excessively heating the column bottom | 138 s | 148 s | Excessively heating the column bottom |
| 10 | Steady-state operation | Excessively heating the column bottom | 150 s | 152 s | Excessively heating the column bottom |

With the fault diagnosing method based on the simulated vaccine according to an embodiment of the present disclosure, the defect of the lack of historical data of an actual production device (or a technological process of the actual production device) may be overcome, and normal running data, fault running data and antibodies are generated by dynamic simulation to be applied to a process industrial fault diagnosis based on an artificial immunity. With new methods for generating antigens, antibodies, an antibody library and an antigen library proposed according to an embodiment of the present disclosure, a large number of different antibodies may be generated by process simulation, cloning and mutation during the process of diagnosing a fault in the technological process, and antibodies are automatically updated while performing the fault diagnosis, which may meet the requirements of an actual industrial process for adaptability. Therefore, the fault in the technological process may be detected effectively, accurately and rapidly, and the type of the fault may be determined.

Any process or method described in a flow chart or described herein in other ways may be understood to include one or more modules, segments or portions of codes of executable instructions for achieving specific logical functions or steps in the process, and the scope of a preferred embodiment of the present disclosure includes other implementations, which should be understood by those skilled in the art.

It should be understood that the various parts of the present disclosure may be realized by hardware, software, firmware or combinations thereof. In the above embodiments, a plurality of steps or methods may be stored in a memory and achieved by software or firmware executed by a suitable instruction executing system.

It would be understood by those skilled in the art that all or a part of the steps carried by the method in the above-described embodiments may be completed by relevant hardware instructed by a program. The program may be stored in a computer readable storage medium. When the program is executed, one or a combination of the steps of the method in the above-described embodiments may be completed.

In addition, individual functional units in the embodiments of the present disclosure may be integrated in one processing module or may be separately physically present, or two or more units may be integrated in one module. The integrated module as described above may be achieved in the form of hardware, or may be achieved in the form of a software functional module. If the integrated module is achieved in the form of a software functional module and sold or used as a separate product, the integrated module may also be stored in a computer readable storage medium.

The above-mentioned storage medium may be a read-only memory, a magnetic disc, an optical disc, etc.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments can not be construed to limit the present disclosure, and changes, alternatives, and modifications can be made in the embodiments without departing from spirit, principles and scope of the present disclosure.

What is claimed is:

1. A fault diagnosing method based on a simulated vaccine, comprising steps of:
   establishing a dynamic simulation model for simulating a start-up operation and a steady-state operation of a technological process according to process information, an operating procedure and historical data of the technological process;
   running the dynamic simulation model to obtain a simulated sample set of simulated running data in a plurality of states, wherein the simulated sample set has various types of simulated samples and comprises a simulated normal sample set and a simulated fault sample set, the simulated normal sample set comprises simulated data sample sets obtained during a normal start-up operation and during a normal steady-state operation, and the simulated fault sample set comprises fault data sample sets corresponding to a plurality of faults generated during the start-up operation and during the steady-state operation;

extracting data within a first predetermined time from the simulated normal sample set to generate a normal simulated vaccine, and extracting data within a second predetermined time from the simulated fault sample set to generate a fault simulated vaccine;

acquiring the historical data of the technological process to generate a historical sample set comprising a historical normal sample set and a historical fault sample set;

obtaining an immune antibody coefficient of the normal simulated vaccine according to a historical normal sample in the historical normal sample set and a normal simulated vaccine corresponding to the historical normal sample in the historical normal sample set, and generating a normal antibody library according to the normal simulated vaccine; and obtaining an immune antibody coefficient of the fault simulated vaccine according to a historical fault sample in the historical fault sample set and a fault simulated vaccine corresponding to the historical fault sample in the historical fault sample set, and generating a fault antibody library according to the fault simulated vaccine.

2. The fault diagnosing method according to claim 1, further comprising:
calculating a minimum difference degree matrix between a fault start-up historical sample and a normal start-up historical sample by a DTW algorithm.

3. The fault diagnosing method according to claim 2, further comprising:
running an actual technological process to obtain a sample of on-line running data; and
extracting a data fragment set within a predetermined time range before a current moment from the sample of the on-line running data.

4. The fault diagnosing method according to claim 3, further comprising:
calculating a difference degree of an antigen at the current moment and each normal antibody in the normal antibody library to obtain a difference degree set; and
determining whether each difference degree in the difference degree set is less than a threshold of the normal antibody library, and if yes, determining that the technological process is normal, otherwise, determining that there is a fault in the technological process.

5. The fault diagnosing method according to claim 4, further comprising:
determining a type of the fault in the technological process after determining that there is the fault in the technological process.

6. The fault diagnosing method according to claim 5, further comprising:
for the start-up operation, acquiring normal start-up sample data of a normal start-up historical sample $H_N^{n \times l}$ under a condition similar to a current operating condition, and calculating a deviation matrix by the DTW algorithm or by a first predetermined formula as a diagnostic antigen;
for the steady-state operation, acquiring a value of each sampling point in a fragment of the on-line running data, and subtracting a datum D obtained at a moment when a fault is detected from the value of each sampling point to obtain a diagnostic antigen;
calculating a difference degree of a diagnostic antigen at the current moment and each fault antibody in the fault antibody library by the DTW algorithm or by a second predetermined formula; and
if the difference degree of the diagnostic antigen at the current moment and one fault antibody is less than a threshold of the fault antibody library, determining that the fault of the technological process is of a corresponding fault type.

7. The fault diagnosing method according to claim 1, wherein the step of establishing the dynamic simulation model comprises:
establishing the dynamic simulation model by a process simulation software or by a differential equation.

8. The fault diagnosing method according to claim 1, wherein the process information comprises a process flow chart, a material state, operating parameters, controller settings and environmental parameters.

9. The fault diagnosing method according to claim 1, wherein the step of running the dynamic simulation model to obtain the simulated sample set of the simulated running data in the plurality of states further comprises:
normalizing each simulated datum in a set of the simulated running data by a following formula to obtain the simulated sample set:

$$X = 0.5 + \frac{x - \overline{X}}{X_{max} - X_{min}}$$

where x is a simulated datum of a variable in a simulated sample, $\overline{X}$ is an average value of historical data of the variable x under an actual normal operating condition, and $X_{max}$ and $X_{min}$ are a maximum value and a minimum value of the historical data of the variable x under the actual normal operating condition respectively.

10. The fault diagnosing method according to claim 3, wherein running the actual technological process to obtain the sample of the on-line running data further comprises:
normalizing the sample of the on-line running data.

11. The fault diagnosing method according to claim 1, further comprising:
acquiring the historical data of the technological process; and
correcting the dynamic simulation model according to the historical data.

12. The fault diagnosing method according to claim 1, wherein the step of running the dynamic simulation model to obtain the simulated sample set of the simulated running data in the plurality of states further comprises:
adding a disturbance within a normal operating range to the dynamic simulation model to generate the simulated normal sample set when the dynamic simulation model is run; and
adding a fault disturbance to the dynamic simulation model to generate the simulated fault sample set when the dynamic simulation model is run,
in which each of the disturbance within the normal operating range and the fault disturbance comprises environmental parameters, a noise and operating parameters.

13. The fault diagnosing method according to claim 6, further comprising:
updating an antibody in a corresponding antibody library by the on-line running data according to a comparison between an on-line antigen and the normal antibody library and a comparison between the on-line antigen and the fault antibody library.

* * * * *